(12) United States Patent
Kozakai et al.

(10) Patent No.: US 7,485,880 B2
(45) Date of Patent: Feb. 3, 2009

(54) CHARGED PARTICLE BEAM SCAN AND IRRADIATION METHOD, CHARGED PARTICLE BEAM APPARATUS, WORKPIECE OBSERVATION METHOD AND WORKPIECE PROCESSING METHOD

(75) Inventors: Tomokazu Kozakai, Chiba (JP); Masashi Muramatsu, Chiba (JP); Ryoji Hagiwara, Chiba (JP)

(73) Assignee: SII NanoTechnology Inc., Chiba (JP)

( * ) Notice: Subject to any disclaimer, the term of this patent is extended or adjusted under 35 U.S.C. 154(b) by 281 days.

(21) Appl. No.: 11/586,190

(22) Filed: Oct. 25, 2006

(65) Prior Publication Data

US 2007/0114454 A1    May 24, 2007

(30) Foreign Application Priority Data

Oct. 28, 2005   (JP)   ............................. 2005-314055

(51) Int. Cl.
*A61N 5/00* (2006.01)
*H01J 37/302* (2006.01)

(52) U.S. Cl. ............................. 250/492.22; 250/492.2; 250/396 R; 250/398; 250/310

(58) Field of Classification Search ............ 250/492.22, 250/492.2, 396 R, 310, 398
See application file for complete search history.

(56) References Cited

U.S. PATENT DOCUMENTS

| | | | | |
|---|---|---|---|---|
| 4,421,988 A | * | 12/1983 | Robertson et al. | 250/492.2 |
| 4,439,681 A | * | 3/1984 | Norioka et al. | 250/310 |
| 4,607,167 A | * | 8/1986 | Petric | 250/492.2 |
| 4,820,928 A | * | 4/1989 | Ooyama et al. | 250/492.2 |
| 2006/0245636 A1 | * | 11/2006 | Kitamura et al. | 382/149 |
| 2007/0075887 A1 | * | 4/2007 | Stovall et al. | 341/155 |
| 2007/0159662 A1 | * | 7/2007 | Kobaru et al. | 358/401 |
| 2008/0160431 A1 | * | 7/2008 | Scott et al. | 430/5 |
| 2008/0224063 A1 | * | 9/2008 | Parker | 250/396 R |

FOREIGN PATENT DOCUMENTS

| | | |
|---|---|---|
| JP | 01-293538 | 11/1989 |
| JP | 06-38329 | 5/1994 |

\* cited by examiner

*Primary Examiner*—Jack I Berman
*Assistant Examiner*—Johnnie L Smith, II
(74) *Attorney, Agent, or Firm*—Brinks Hofer Gilson & Lione

(57) ABSTRACT

After a scan area for observing or processing a mask is set, a computer of the charged particle beam apparatus determines a plurality of scan lines in the scan area by the following steps of: setting a scan line along the outer circumference of the scan area; determining a scan line inside and along the thus set scan line; determining a scan line inside and along the thus determined scan line; and repeating the step of determining a scan line. After the scan lines are determined, the computer controls a scanning circuit to apply an ion beam to the scan lines while thinning out scan lines and/or pixels.

8 Claims, 6 Drawing Sheets

CHARGED PARTICLE BEAM SCAN AND IRRADIATION METHOD, CHARGED PARTICLE BEAM APPARATUS, WORKPIECE OBSERVATION METHOD AND WORKPIECE PROCESSING METHOD

This application claims priority under 35 U.S.C. §119 to Japanese Patent Application No. JP2005-314055 filed Oct. 28, 2005, the entire content of which is hereby incorporated by reference.

BACKGROUND OF THE INVENTION

The present invention relates to a charged particle beam scan and irradiation method, charged particle beam apparatus, workpiece observation method and workpiece processing method.

When an insulator workpiece is observed or processed by a charged particle beam, such as an ion beam or electron beam (hereinafter also simply referred to as "beam"), the irradiation beam is raster scanned and positioned on the workpiece. Raster scanning is how to sequentially irradiate an array of points. Conventionally, to achieve good observed images and process results, the scanning order in raster scanning is skillfully modified into, for example, a thinned-out scanning order (scanning at an interval formed of a predetermined number of pixels) (see, for example, JP-B-6-38329). The thinning-out scanning order solves a problem of a charging effect resulting from ion beam irradiation, that is, secondary ions emitted from a mask are not successfully detected. FIG. 8 shows the scanning order of raster scan-based thinned-out scanning. In the following description, the left-to-right direction is the X direction and the up-to-down direction is the Y direction. The numbers in some of the pixels indicate the beam irradiation order. A pixel used herein is a unit area for single beam irradiation and an area divided in the X (horizontal) and Y (vertical) directions at an interval corresponding to a minimum unit of irradiation beam deflection. As shown in the figure, in the raster scan-based thinned-out scanning, a scan area is divided into pixels and for a certain row of pixels, the charged particle beam is applied to the center positions of pixels spaced apart by a predetermined number of pixels in the X direction. Once the beam irradiation is completed for that one row, the beam irradiation is repeated again at the interval formed of the predetermined number of pixels in the X direction for a row spaced apart by a predetermined number of lines (pixels) in the Y direction. As shown in the flowchart in FIG. 9, in raster scanning, after beam irradiation positions are determined for a certain row, beam irradiation is turned on, and once the irradiation for that one row is completed, the beam irradiation is temporarily turned off. Then, beam irradiation positions are determined for the next row to be scanned and the beam irradiation is turned on again for beam irradiation. This procedure is repeated to apply the beam to the scan area until the process is completed. Turning beam irradiation off herein used means that the beam is blanked before it reaches the workpiece so that the beam does not reach the workpiece. Turning beam irradiation on herein used means that the beam is not blanked but applied to the workpiece. On the other hand, for forming a patterned film on a workpiece surface by spraying a compound gas from a gas gun onto the workpiece and applying a focused ion beam on the workpiece surface with the compound deposited thereon, a method for improving patterned film formation efficiency is disclosed, in which an ion beam irradiation optical system is provided with means for digitally scanning the ion beam and the digital scanning means scans the ion beam at an interval greater than or equal to two pitches (see, for example, JP-A-1-293538).

In general, the contour of a process area of a workpiece does not always match with the boundary of pixels used in raster scanning. Therefore, to accurately process a process area that does not match with the boundary of pixels used in raster scanning, it is unfortunately required to specify the scan area such that it matches with the contour of the process area with sub-pixel accuracy. As described above, in raster scanning, since beam irradiation is temporarily turned off after beam irradiation is completed for a certain row and beam irradiation is turned on again to apply the beam to the next row in a repeated manner, the start position of charged particle beam irradiation matches with the contour of the process area. At the start position of beam irradiation, instability of the beam irradiation timing may cause process nonuniformity with respect to other positions. In particular, when the charged particle beam is applied to process the workpiece while a process gas, such as an etching gas or deposition gas, is sprayed to process positions, there is also a problem that the processed shape of the contour, which is the most important portion, is deteriorated.

On the other hand, in vector scanning, beam irradiation positions are specified with sub-pixel accuracy and a process area is scanned in a single stroke without interrupting beam irradiation. Although vector scanning can solve the above problem of raster scanning, the method for changing the scanning order, such as raster scan-based thinned-out scanning, cannot be applied without modification. As described above, to process a workpiece, the workpiece is irradiated with an irradiation beam while a process gas, such as an etching gas or deposition gas, is sprayed onto the workpiece. In a process using thinned-out scanning, as a scan line is scanned multiple times, the process gas that has been sprayed on the workpiece during the previous scans gets diffused in the process area. Therefore, the process gas can be effectively used in the process. On the other hand, in vector scanning, as beam irradiation is carried out before the process gas that has been sprayed onto the workpiece gets diffused into the next process position, there is a problem that the process gas that has been sprayed cannot be effectively used.

The invention has been made in view of such situations and aims to provide a charged particle beam scan and irradiation method, charged particle beam apparatus, workpiece observation method and workpiece processing method capable of improving contour line observation and process accuracy and effectively using a process gas sprayed on a workpiece during the process.

SUMMARY OF THE INVENTION

The invention has been made to solve the above problems and provides a charged particle beam scan and irradiation method using a charged particle beam apparatus that utilizes charged particle beam irradiation to observe or process a workpiece, characterized in that the method comprises the steps of: setting an observation or process area; determining a plurality of scan lines in the process or observation area; the step of determining a plurality of scan lines comprising the steps of: setting a scan line along the outer circumference of the observation or process area; determining a scan line inside and along the thus set scan line; determining a scan line inside and along the thus determined scan line; and repeating the step of determining a scan line; and applying the charged particle beam to the determined scan lines.

Another embodiment of the invention is the charged particle beam scan and irradiation method, characterized in that the step of applying the charged particle beam to the scan lines comprises the steps of: applying the charged particle beam to one scan line with an interval formed of a predetermined number of pixels; after the last pixel in the previous step is irradiated, returning to the start position of the scan line and applying the charged particle beam to pixels, to which the charged particle beam is not yet applied, with the interval formed of the predetermined number of pixels; repeating the step of applying the charged particle beam until all the pixels in the scan line are irradiated with the charged particle beam; and shifting to the next scan line and repeating the step of applying the charged particle beam until all the pixels in the process area are irradiated with the charged particle beam.

Another embodiment of the invention is the charged particle beam scan and irradiation method, characterized in that the step of applying the charged particle beam to the scan lines comprises the steps of: applying the charged particle beam to each of the scan lines with an interval formed of a predetermined number of pixels; and after the last scan line is irradiated, returning to the first scan line and repeating the step of applying the charged particle beam to pixels in each of the scan lines, to which the charged particle beam is not yet applied, with the interval formed of the predetermined number of pixels until all the pixels in the process area are irradiated with the charged particle beam.

Another embodiment of the invention is the charged particle beam scan and irradiation method, characterized in that the step of applying the charged particle beam to the scan lines comprises the steps of: applying the charged particle beam to one scan line; applying the charged particle beam, among the scan lines inside the one scan line, not to a predetermined scan line but to the scan line next to the predetermined scan line; and applying the charged particle beam to the predetermined scan line to which the charged particle beam was not applied in the previous step.

Another embodiment of the invention is the charged particle beam scan and irradiation method, characterized in that in the step of applying the charged particle beam to the scan lines, the scan start position of a scan line and the scan start position of a scan line next to the scan line are spaced apart from each other.

The invention provides a charged particle beam apparatus that utilizes charged particle beam irradiation to observe or process a workpiece, characterized in that the apparatus comprises: scan line determining means that after an observation or process area is set, determines a plurality of scan lines in the process or observation area by the following steps of: setting a scan line along the outer circumference of the observation or process area; determining a scan line inside and along the thus set scan line; determining a scan line inside and along the thus determined scan line; and repeating the step of determining a scan line; and scanning control means that controls the charged particle beam to be applied to the scan lines determined by the scan line determining means.

The invention provides a workpiece observation method, characterized in that the method comprises the steps of: applying a charged particle beam to a workpiece using the charged particle beam scan and irradiation method; and forming a workpiece pattern image based on the detected intensity of secondary charged particles emitted from the workpiece.

The invention provides a workpiece processing method, characterized in that the method comprises the step of applying a charged particle beam to a workpiece to process it using the charged particle beam scan and irradiation method.

According to the invention, as an area can be specified such that it matches with the contour of a process area with sub-pixel accuracy, the process area can be accurately processed even when the contour of the process area does not match with the boundary of pixels used in raster scanning. Furthermore, a process gas sprayed on a workpiece during the process can be effectively used.

DETAILED DESCRIPTION OF THE PREFERRED EMBODIMENTS

Figure 1:
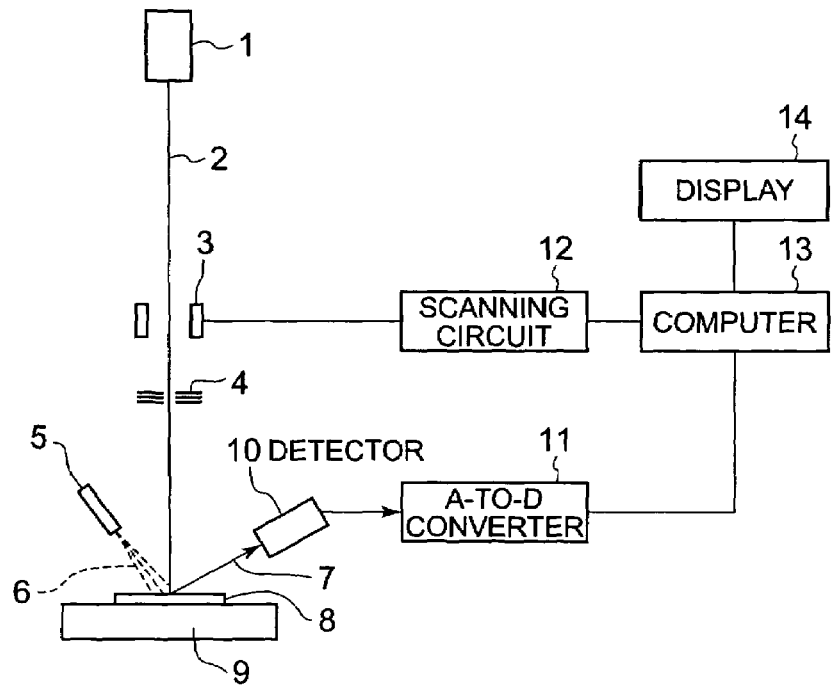
FIG. 1 is a block diagram showing the overall configuration of a charged particle beam apparatus.

One embodiment of the invention will be described in detail below with reference to the drawings. FIG. 1 shows the overall configuration of a charged particle beam apparatus according to one embodiment of the invention. Reference number 1 denotes an ion source, which emits an ion beam 2. Reference number 3 denotes scanning electrodes including X and Y electrodes, which scan an irradiation spot over a predetermined range in the X-Y plane of a mask 8, which is a workpiece to which the ion beam 2 is applied. Reference number 4 denotes an objective lens that focuses the ion beam 2 into a spot on an object to be irradiated, which is the surface of the mask 8. Reference number 5 denotes a gas gun that, when a white defect region on the mask 8 is to be repaired, sprays a process gas 6, which is a deposition gas, to deposit a light blocking film to repair the white defect, while the ion beam 2 is scanned and applied.

To repair a black defect region, the gas gun sprays an etching gas onto an unnecessary deposited portion to etch that portion for repair, while the ion beam 2 is selectively applied to that portion. Reference number 9 denotes an X-Y stage, on which the mask 8 is mounted and moved in the X or Y direction. Reference number 10 denotes a detector that detects the intensity of secondary charged particles 7 forced to be emitted from the surface of the mask 8 through irradiation of the ion beam 2. The two-dimensional intensity distribution of the secondary charged particles corresponds to the pattern formed on the mask 8. Reference number 11 denotes an A-to-D converter that converts an analog measurement of the secondary charged particle intensity into digital data. The digital data is inputted in a computer 13, which reproduces an enlarged image of the pattern of the mask 8 and displays it on a display 14 such as a CRT (cathode ray tube). Reference number 12 denotes a scanning circuit that receives an ion beam irradiation range from the computer 13 and controls the scanning electrodes 3.

Figure 2:
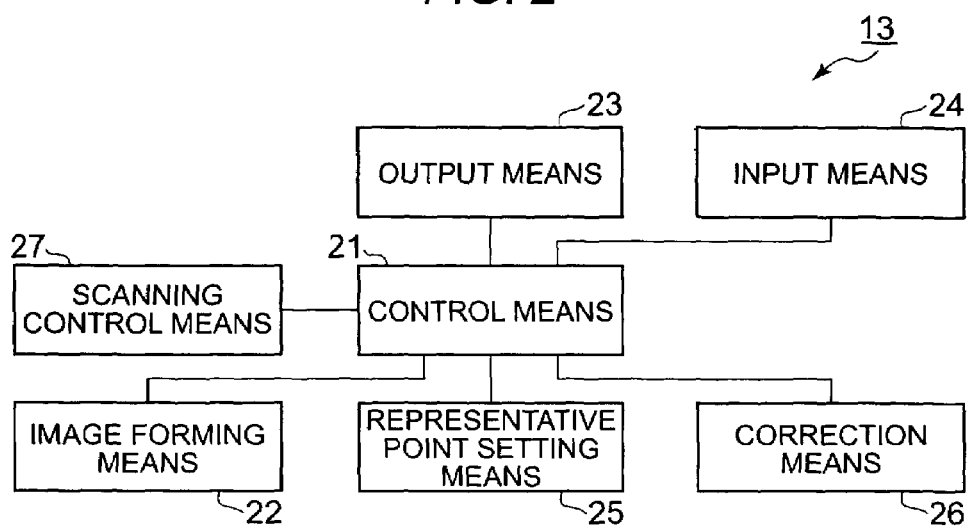
FIG. 2 is a block diagram showing the configuration of the computer in FIG. 1.

FIG. 2 is a block diagram illustrating the internal configuration of the computer 13 shown in FIG. 1. Only functional blocks relevant to the invention are extracted and shown. Control means 21 includes a CPU (central processing unit) and various memories and performs various tasks, such as controlling various portions, temporarily storing data, and forwarding data. Image forming means 22 forms an image of a workpiece pattern of the mask 8 based on the intensity of the secondary charged particles 7 detected by the detector 10. Output means 23 displays the image on the display 14. Input means 24 includes a keyboard and a mouse and functions to acquire information inputted by an operator. Scan line determining means 25 sets a scan area that is an area of the mask 8 to be processed or observed, and determines scan lines in the scan area. Irradiation control means 26 controls irradiation of the ion beam 2 by turning it on and off. Scanning control means 27 controls the scanning circuit 12.

Figure 3:
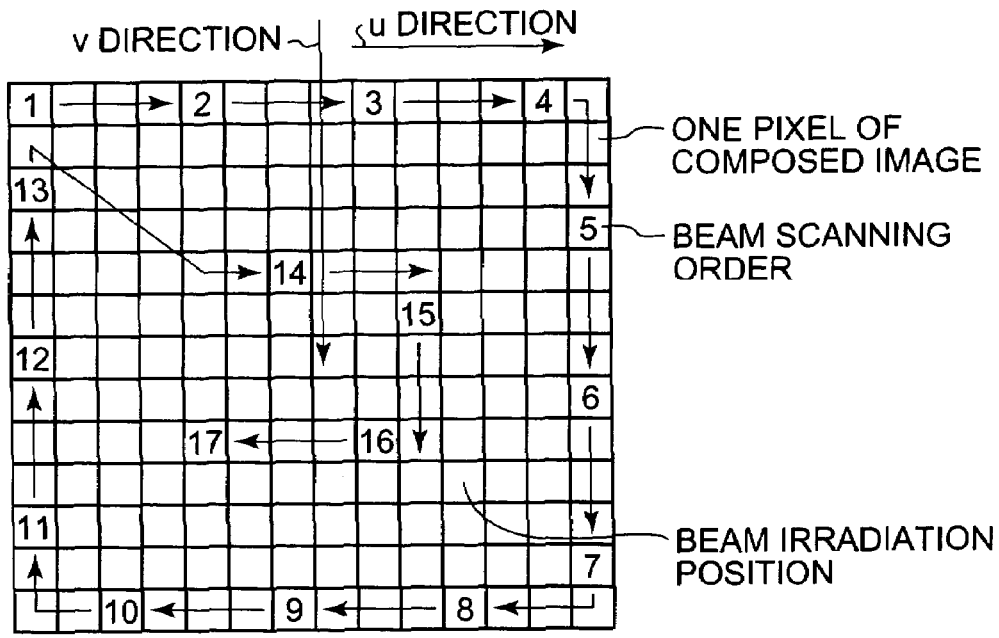
FIG. 3 is a view schematically explaining an ion beam scan and irradiation method.

FIG. 3 schematically explains an ion beam scan and irradiation method used in the above charged particle beam apparatus. In the following description, the direction along the outer circumference of a scan area is the u direction and the direction from the outer circumference of the scan area to the center thereof is the v direction. Thinning out (inserting a predetermined interval) in the u and v directions will be described by way of example. After a scan area is set, the scan line determining means 25 of the computer 13 determines a plurality of scan lines in the process or observation area by the following steps of: setting a scan line along the outer circumference of the scan area; determining a scan line inside and along the thus set scan line; determining a scan line inside and along the thus determined scan line; and repeating the step of determining a scan line. After the scan lines are determined, the irradiation control means 26 applies the ion beam 2 to the mask 8 along the outermost scan line, that is, the scan line along the outer circumference of the scan area in the u direction at an interval formed of a predetermined number of pixels. Once the one-loop scan along the scan line for the above row is completed, the charged particle beam is applied along the next scan line spaced apart by an interval consisting of a predetermined number of lines, again at the interval formed of the predetermined number of pixels in the u direction. In this way, the ion beam 2 will be applied to the center positions of the pixels in order of the numbers in the pixels.

Figure 4:
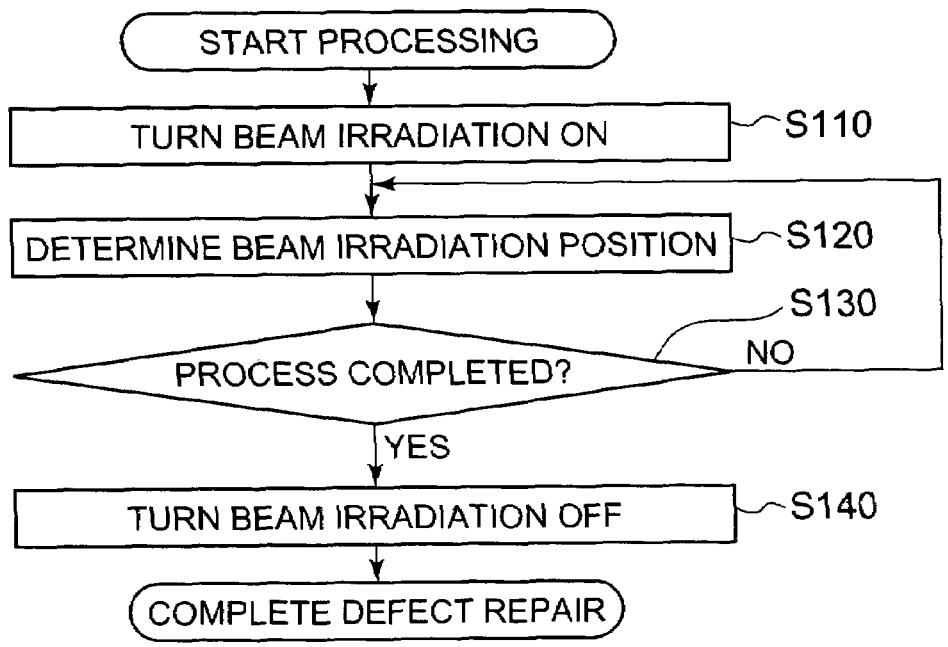
FIG. 4 is a flowchart of a workpiece processing method.

FIG. 4 is a flowchart showing a workpiece processing method used in the above charged particle beam apparatus. The mask 8 to be processed is irradiated with the ion beam 2, and the detector 10 detects the intensity of the secondary charged particles 7 emitted from the mask 8. The image forming means 22 of the computer 13 acquires the intensity of the secondary charged particles 7 detected by the detector 10 via the A-to-D converter 11 to form a workpiece pattern image. The output means 23 enlarges the formed image and displays it on the diplay 14. The operator uses the input means 24, such as a mouse, to set a defect area on the workpiece pattern displayed on the display 14. Alternatively, the defect area may be set by pre-storing correct process pattern data in the computer 13 and overlaying this process pattern on the workpiece pattern of the composed image to find the difference between these patterns. Based on the thus set defect area as a scan area, the scan line determining means 25 determines scan lines in the scan area.

The irradiation control means 26 turns beam irradiation on (step S110). The scan control means 27 selects the scan line along the outer circumference of the scan area as the first scan line, and controls the scanning circuit 12 to apply the ion beam 2 onto the selected scan line to process the mask 8 (step S120). After the beam irradiation on the scan line is completed, and if there is no input instructing termination of the repair of the defect area (step S130: NO), the scan control means 27 selects the next scan line and repeats the process starting from step S120 in which the ion beam 2 is applied onto the selected scan line to process the mask 8. If there is an input instructing termination of the repair of the defect area in the process completion step (step S130: YES), the irradiation control means 26 turns beam irradiation off (step S140).

Observation of a workpiece may be carried out in a procedure similar to that shown in FIG. 4. A workpiece is observed in the following manner: When the ion beam 2 is applied onto scan lines in a scan area (observation area), the detector 10 detects the intensity of the secondary charged particles 7 emitted from the mask 8. The image forming means 22 of the computer 13 acquires the intensity of the secondary charged particles 7 detected by the detector 10 via the A-to-D converter 11 to form an image of the workpiece pattern. The output means 23 enlarges the formed image and displays it on the display 14.

Figure 5:
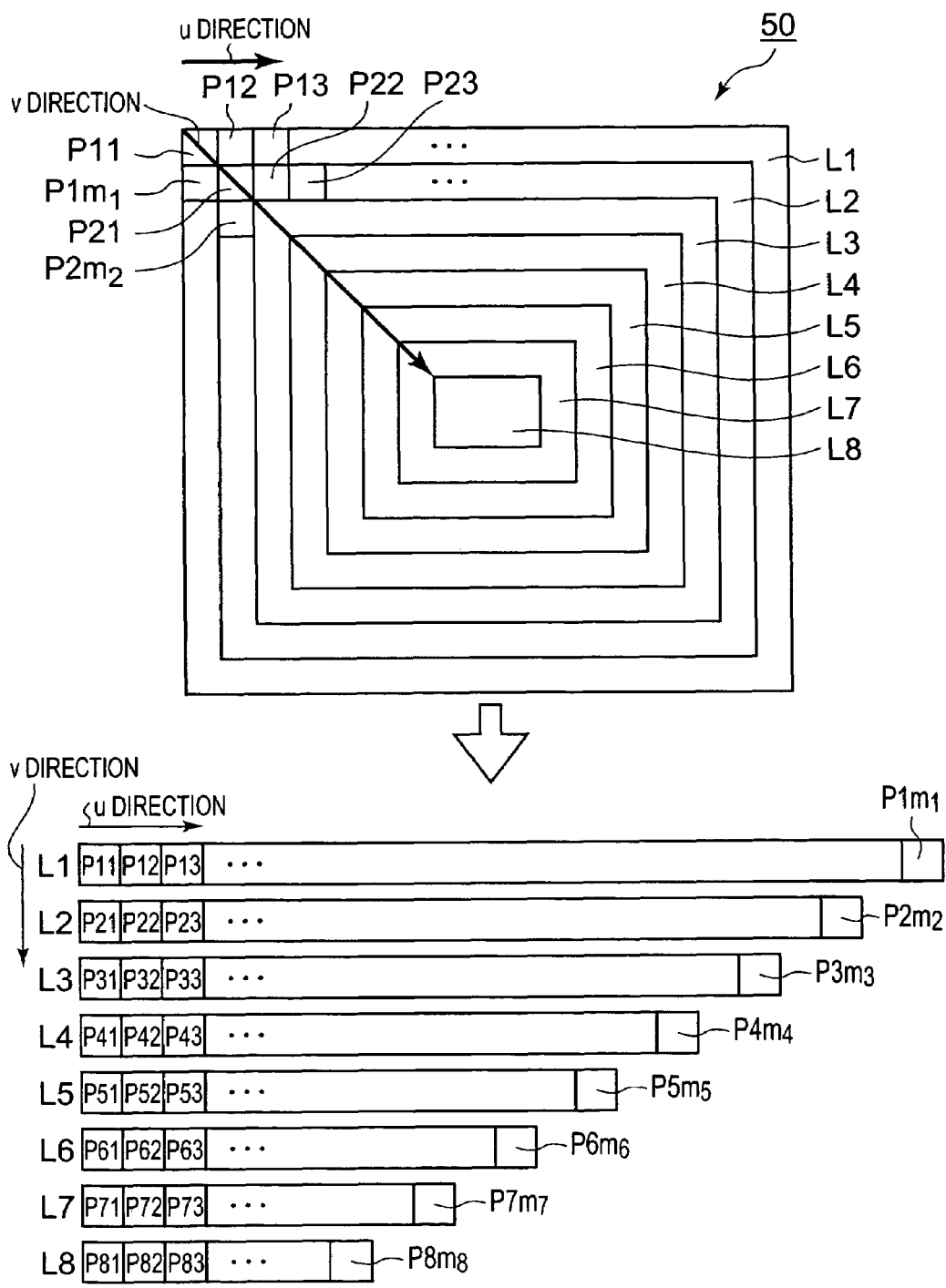
FIG. 5 is a view explaining how to determine a scan line.

FIG. 5 explains how to determine a scan line. A scan area 50 is shown in FIG. 5 and the scan line determining means 25 of the computer 13 sets a scan line L1 along the outer circumference of the scan area 50. The direction along the outer circumference is the u direction. The scan start position of the scan line L1 is arbitrarily selected. Subsequently, the scan line determining means 25 moves the scan line one pixel in the v direction, which is the direction from the scan line L1 to the center of the scan area 50, to determine a scan line L2. Furthermore, the scan line determining means 25 moves the scan line one pixel in a direction from the scan line L2 toward the v direction to determine a next scan line L3. The scan line determining means 25 repeats this procedure until it eventually reaches the center of the scan area 50, thereby determining all the scan lines L1 to Ln (n=8 in FIG. 5). Now, let the pixels forming a scan line Lk (k=1 to n) be Pk1 to Pkm$_k$. That is, the scan line Lk is formed of m$_k$ pixels. The pixel Pk1 is the scan start position of the scan line Lk. Hereinafter, any one of the scan lines L1 to Ln is referred to as "scan line L."

In FIG. 5, the scan start position of the scan line Lk (K=2 to n) is the pixel moved in the v direction from the pixel of the scan start position of the scan line L(k−1), which is outside of the scan line Lk by one line. In this way, the scan start positions of the scan lines L align in the v direction. Alternatively, the pixel of the scan start position of the scan line Lk (K=2 to n) may be a pixel that is not only moved in the v direction from the pixel of the scan start position of the scan line L(k−1), which is outside of the scan line Lk by one line, but also moved in the u direction by a predetermined amount. By shifting the scan start position for each scan line in the u direction, process nonuniformity due to nonuniformity in beam irradiation timing at a scan start position can be reduced.

If the scan lines L set as described above are lined up in order of the v direction from above and the pixels in each of the scan lines L are folded out in order of the u direction into a horizontal 1-dimensional array, this can be considered as raster scanning by interpreting the u and v directions as the X and Y directions.

Figure 6:
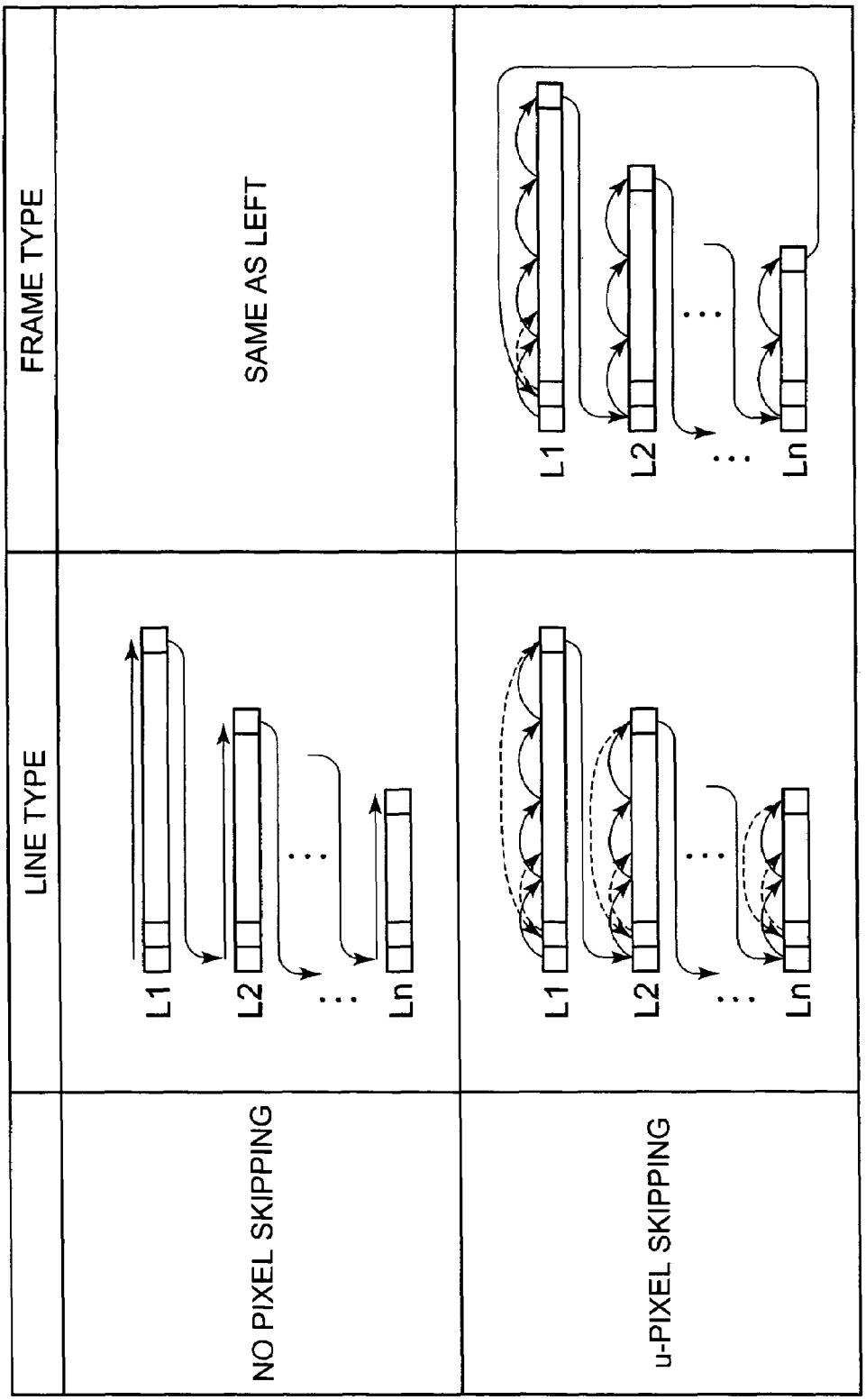
FIG. 6 shows a beam irradiation order.
Figure 7:
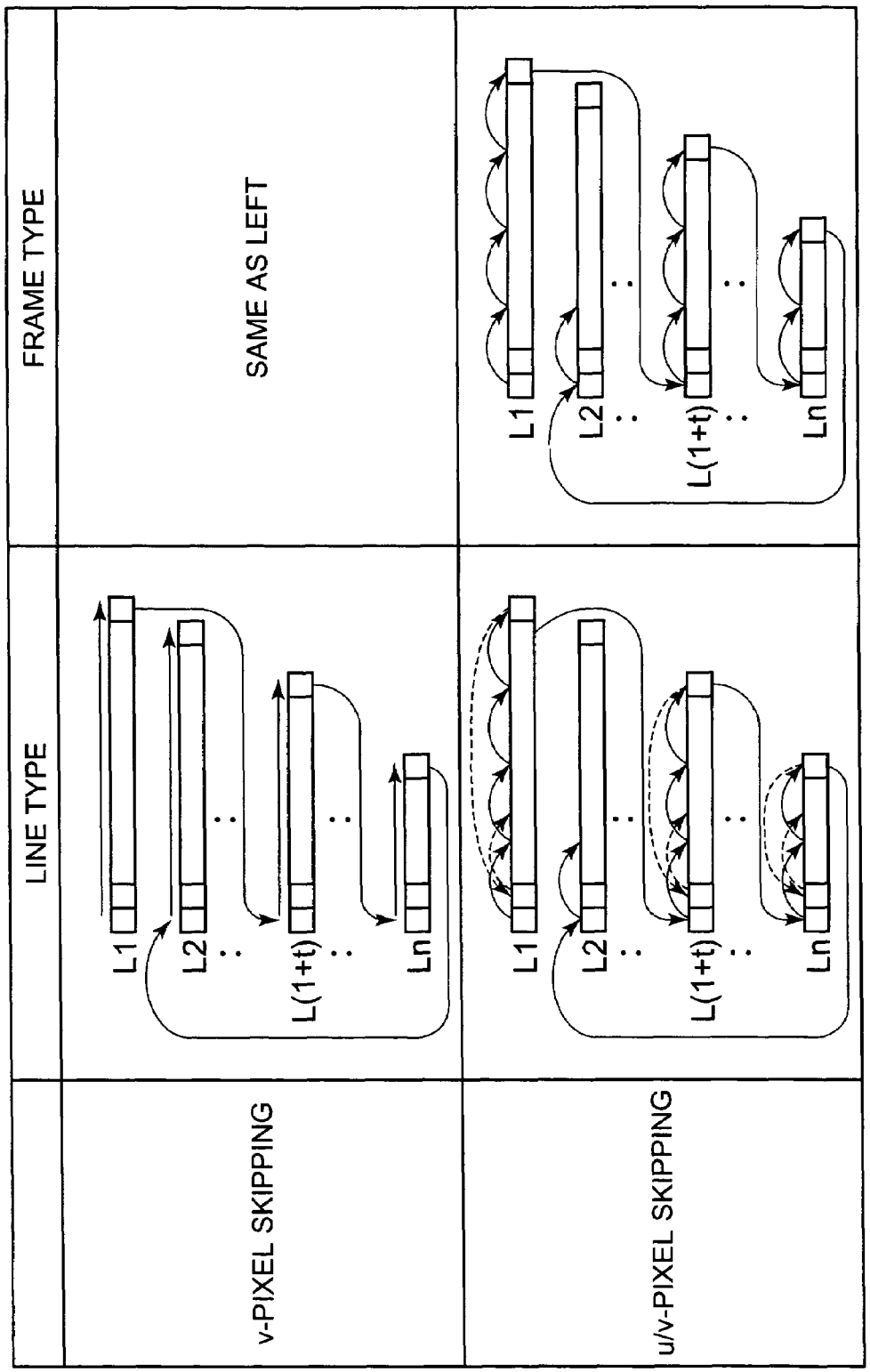
FIG. 7 shows a beam irradiation order.
Figure 8:
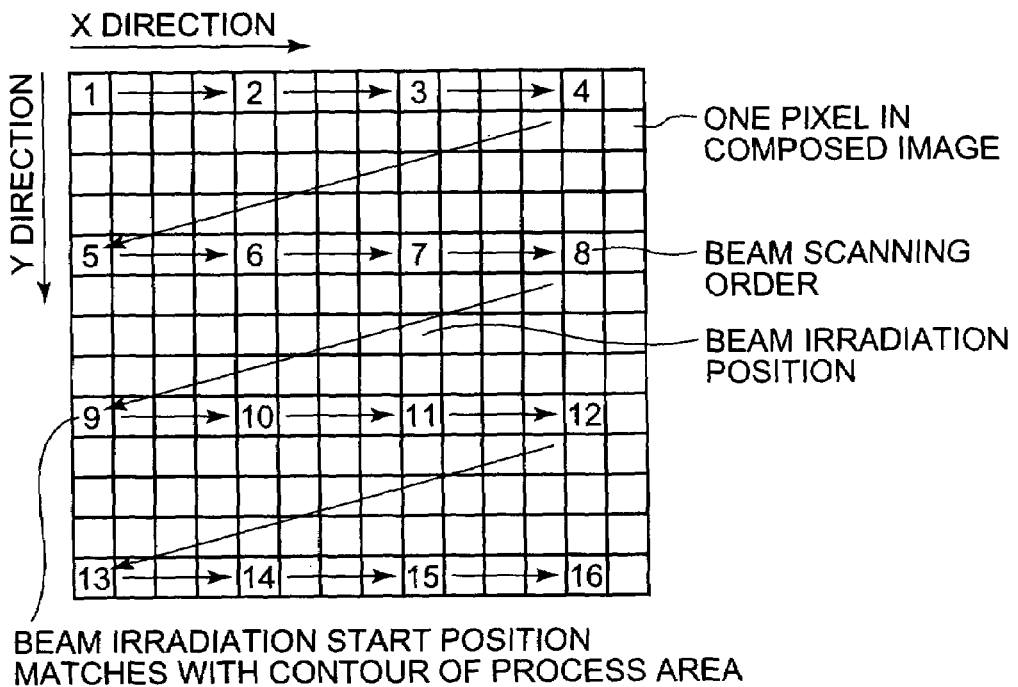
FIG. 8 shows a scan and irradiation method of related art.
Figure 9:
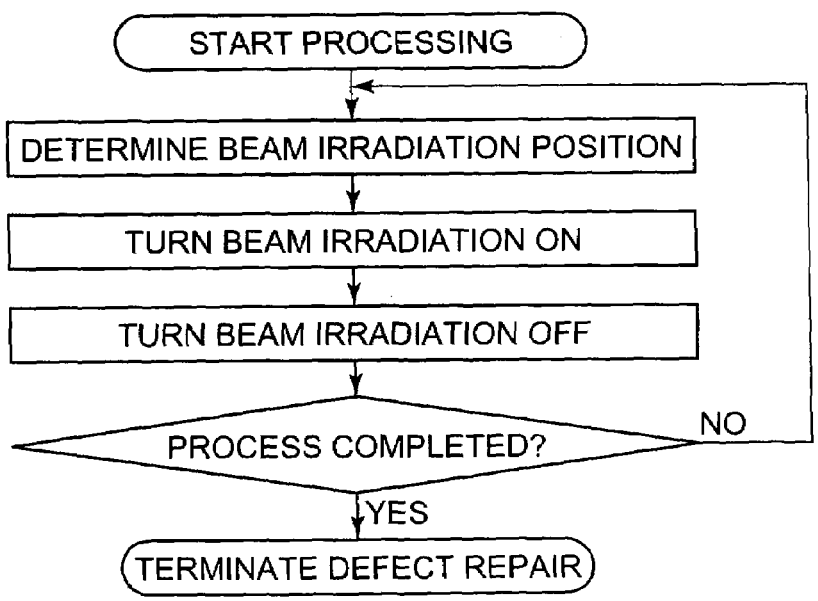
FIG. 9 is a flowchart illustrating a workpiece processing method of related art.

FIGS. 6 and 7 show beam irradiation orders depending on the type of thinned-out scanning. The dotted line in each figure shows a second or later loop for a same scanning line L. Beam irradiation on a scan area may be carried out in various thinned-out patterns, such as "no thinning out" in which scanning is carried out in a non thinned-out manner, neither in the u (pixel) direction nor in the v (scan line) direction, "u-thinning out" in which thinned-out scanning is carried out in the u direction, "v-thinning out" in which thinned-out scanning is carried out in the v direction, and "u/v-thinning out" in which thinned-out scanning is carried out in the u and v directions. Beam irradiation is also categorized in the following two types, "line type" in which after beam irradiation is completed on all pixels in one scan line, the beam irradiation operation proceeds to the next scan line, and "frame type" in which after one-loop beam irradiation is completed for one scan line, the beam irradiation operation proceeds to the next scan line. Irradiation order will be specifically described below for each combination of the type and thinned-out pattern. In the following description, when thinned-out scanning is carried out in the u direction, the pixel for next beam irradiation is s pixels ahead of the current irradiated pixel in the u direction, and when thinned-out scanning is carried out in the v direction, the next scan line is t lines ahead of the current irradiated line in the v direction.

Firstly, no thinning out and u-thinning out will be described with reference to FIG. 6. For a combination of the line type or frame type and no thinning out, beam irradiation is first carried out for the scan line L1 in order of the pixels P11, P12, P13, ..., P1$m_1$ and then for the scan line L2 in order of the pixels P21, P22, P23, ..., P2$m_2$. Thus, once beam irradiation is completed on the pixels Pk1, Pk2, Pk3, ..., Pk$m_k$ in the scan line Lk, beam irradiation is carried out on the pixels P(K+1)1, P(K+1)2, P(K+1)3, ..., P(K+1)M$_{(K+1)}$ in the scan line L(K+1). Finally, beam irradiation is carried out for the scan line Ln in order of the pixels Pn1, Pn2, Pn3, ..., Pn$m_n$, so that beam irradiation is completed on all the pixels in the scan area.

For a combination of the line type and u-thinning out, beam irradiation is first carried out on every s-th pixel starting from the pixel P11 for the scan line L1. Upon completion of one-loop beam irradiation for the scan line L1, beam irradiation is continuously carried out on every s-th pixel starting from the pixel P12, to which beam irradiation is not yet carried out. This is repeated until beam irradiation is completed on all the pixels in the scan line L1. Beam irradiation is then carried out on every s-th pixel starting from the pixel P21 in a sequential manner for the scan line L2 as in the case of the scan line L1. Thus, after one-loop beam irradiation on every s-th pixel starting from the pixel Pk1 for the scan line Lk is completed, one-loop beam irradiation is continuously carried out on every s-th pixel, to which beam irradiation is not yet carried out, for the same scan line Lk. This is repeated until beam irradiation is completed on all the pixels in the scan line Lk. The beam irradiation operation then proceeds to the next scan line L(k+1) and is carried out in a similar procedure. This operation will be sequentially carried out until it is carried out for the scan line Ln.

For a combination of the frame type and u-thinning out, one-loop beam irradiation is first carried out on every s-th pixel starting from the pixel P11 for the scan line L1. After the one-loop beam irradiation is completed, another one-loop beam irradiation is carried out on every s-th pixel starting from the pixel P21 for the next scan line L2. Thus, when one-loop beam irradiation is completed for the rest of the scan lines ending with the scan line Ln at every s-th pixel for each scan line, the operation returns to the scan line LI again, one-loop beam irradiation is carried out on every s-th pixel, to which beam irradiation is not yet carried out. One-loop beam irradiation is then carried out on every s-th pixel, to which beam irradiation is not yet carried out, for the scan line L2. Thus, one-loop beam irradiation carried out at every s-th pixel is repeated in order of scan lines L1 to Ln until beam irradiation is completed on all the pixels in the scan area.

Next, v-thinning out and u/v-thinning out will be described with reference to FIG. 7. For a combination of the line type or frame type and v-thinning out, beam irradiation is first sequentially carried out for the scan line L1 in order from the pixels P11 to P1$m_1$ and then for the scan line L(1+t), which is inside the scan line L1 by t lines, in order of the pixels P(1+t)1 to P(1+t)$m_{(1+t)}$. Beam irradiation is repeated, for the scan line that is inside the scan line L(1+t) by t lines, on pixels starting from the start pixel in a sequential manner. When there is no scan line that is inside the current scan line by t lines, the operation returns to the scan line L2 and beam irradiation is carried out on pixels starting from the pixel P21 in a sequential manner. Thus, after beam irradiation is completed for the scan line Lk in order from the pixels Pk1 to P1$m_k$ and if there is a scan line L(k+t) that is inside the scan line Lk by t lines, the beam irradiation operation proceeds to the scan line L(k+t) and is carried out on pixels starting from the pixel P(k+t)1 in a sequential manner, while if there is no scan line that is inside the scan line Lk by t lines, the operation proceeds to an outer scan line and a similar process will be carried out. This is repeated until beam irradiation is completed on all the scan lines.

For a combination of the line type and u/v-thinning out, beam irradiation is first carried out on every s-th pixel starting from the pixel P11 for the scan line L1. Upon completion of one-loop beam irradiation for the scan line L1, beam irradiation is continuously carried out on every s-th pixel starting from the pixel P12, to which beam irradiation is not yet carried out. This is repeated until beam irradiation is completed on all the pixels in the scan line L1. Beam irradiation is then carried out, again on every s-th pixel for the scan line L(1+t), which is inside the scan line L1 by t lines. After beam irradiation is completed on all the pixels in the scan line L(1+t), the operation proceeds to the scan line that is inside the scan line L(1+t) by t lines and beam irradiation is carried out in a similar procedure. This operation is repeated and if there is no scan line that is inside the current scan line by t lines, the operation returns to the scan line L2 and beam irradiation is carried out on every s-th pixel starting from the pixel P21. Thus, after one-loop beam irradiation on every s-th pixel starting from the pixel Pk1 for the scan line Lk is completed, beam irradiation is continuously carried out on every s-th pixel, to which beam irradiation is not yet carried out, for the same scan line Lk. This is repeated until beam irradiation is completed for all the pixels in the scan line Lk. If there is a scan line L(k+t) that is inside the scan line Lk by t lines, the operation proceeds to the scan line L(k+t), while if there is no scan line that is inside the scan line Lk by t lines, the operation proceeds to an outer scan line and beam irradiation will be carried out in a similar procedure. This is repeated until beam irradiation is completed for all the scan lines.

For a combination of the frame type and u/v-thinning out, beam irradiation is first carried out on every s-th pixel starting from the pixel P11 for the scan line L1. Upon completion of one-loop beam irradiation for the scan line L1, one-loop beam irradiation is then carried out on every s-th pixel starting from the pixel P(1+t)1 for the scan line L(1+t), which is inside the scan L1 by t lines. One-loop beam irradiation on every s-th pixel for a scan line that is inside the current scan line by t lines is repeated and if there is no scan line that is inside the current scan line by t lines, the operation returns to the scan line L2 and one-loop beam irradiation is carried out on every s-th pixel starting from the pixel P21. After one-loop beam irradiation on every s-th pixel for all the scan lines L1 to Ln is completed, the operation returns to the scan line L1 and one-loop beam irradiation is carried out on every s-th pixel, to which beam irradiation is not yet carried out. Then, one-loop beam irradiation is repeated on every s-th pixel, to which beam irradiation is not yet carried out, for the scan line L(1+t) that is inside the scan line L1 by t lines. Thus, after one-loop beam irradiation on every s-th pixel, to which beam irradiation is not yet carried out, for the scan line Lk is completed, and if there is a scan line L(k+t) that is inside the scan line Lk by t lines, the operation proceeds to the scan line L(k+t), while if there is no scan line that is inside the scan line Lk by t lines, the operation proceeds to an outer scan line, and one-loop beam irradiation is carried out on every s-th pixel, to which beam irradiation is not yet carried out. This is repeated until beam irradiation is carried out on all the pixels in the scan area.

In the above embodiments, although the charged particle beam apparatus is an ion beam irradiation apparatus, it may be an electron beam irradiation apparatus or the like.

The computer 13 has a computer system therein. The operation process of the image forming means 22, the scan line determining means 25, the irradiation control means 26 and the scanning control means 27 described above is stored on a computer readable recording medium in the form of a program. The computer system reads out the program and executes it to perform the above process. The computer system used herein includes an OS and hardware, such as peripheral devices.

The "computer system" includes, if it uses the WWW system, a website providing environment (or displaying environment). The "computer readable recording medium" is a portable medium such as a flexible disc, magneto-optical disc, ROM and CD-ROM, and a storage device, such as a hard disk, built in the computer system. Furthermore, the "computer readable recording medium" may also include a medium that dynamically holds a program for a short period of time, such as a communication line when a program is transmitted via a network such as the Internet or a communication network such as a telephone network, and a medium that holds a program for a fixed period of time, such as a volatile memory in a computer system serving as a server or client in the above situation. The program may be a program that accomplish part of the above functions, or may be a program that can accomplish the above functions in combination with a program that has been already stored in the computer system.

What is claimed is:

1. A charged particle beam scan and irradiation method using a charged particle beam apparatus that utilizes charged particle beam irradiation to observe or process a workpiece comprising the steps of:
   setting an observation or process area;
   determining a plurality of scan lines in the process or observation area; the step of determining a plurality of scan lines comprising the steps of:
   setting a scan line along the outer circumference of the observation or process area;
   determining a scan line inside and along the thus set scan line;
   determining a scan line inside and along the thus determined scan line; and
   repeating the step of determining a scan line; and
   applying the charged particle beam to the determined scan lines.

2. The charged particle beam scan and irradiation method according to claim 1, wherein the step of applying the charged particle beam to the scan lines comprises the steps of:
   applying the charged particle beam to one scan line with an interval formed of a predetermined number of pixels;
   after the last pixel in the previous step is irradiated, returning to the start position of the scan line and applying the charged particle beam to pixels, to which the charged particle beam is not yet applied, with the interval formed of the predetermined number of pixels;
   repeating the step of applying the charged particle beam until all the pixels in the scan line are irradiated with the charged particle beam; and
   shifting to the next scan line and repeating the step of applying the charged particle beam until all the pixels in the process area are irradiated with the charged particle beam.

3. The charged particle beam scan and irradiation method according to claim 1, wherein the step of applying the charged particle beam to the scan lines comprises the steps of:
   applying the charged particle beam to each of the scan lines with an interval formed of a predetermined number of pixels; and
   after the last scan line is irradiated, returning to the first scan line and repeating the step of applying the charged particle beam to pixels in each of the scan lines, to which the charged particle beam is not yet applied, with the interval formed of the predetermined number of pixels until all the pixels in the process area are irradiated with the charged particle beam.

4. The charged particle beam scan and irradiation method according to claim 1, wherein the step of applying the charged particle beam to the scan lines comprises the steps of:
   applying the charged particle beam to one scan line;
   applying the charged particle beam, among the scan lines inside the one scan line, not to a predetermined scan line but to the scan line next to the predetermined scan line; and
   applying the charged particle beam to the predetermined scan line to which the charged particle beam was not applied in the previous step.

5. The charged particle beam scan and irradiation method according to claim 1, characterized in that in the step of applying the charged particle beam to the scan lines, the scan start position of a scan line and the scan start position of a scan line next to the scan line are spaced apart from each other.

6. A charged particle beam apparatus that utilizes charged particle beam irradiation to observe or process a workpiece comprising:
   scan line determining means that after an observation or process area is set, determines a plurality of scan lines in the process or observation area by the following steps of:
   setting a scan line along the outer circumference of the observation or process area; determining a scan line inside and along the thus set scan line; determining a scan line inside and along the thus determined scan line; and repeating the step of determining a scan line; and
   scanning control means that controls the charged particle beam to be applied to the scan lines determined by the scan line determining means.

7. A workpiece observation method comprising the steps of: applying a charged particle beam to a workpiece using the charged particle beam scan and irradiation method according to claim 1; and
   forming a workpiece pattern image based on the detected intensity of secondary charged particles emitted from the workpiece.

8. A workpiece processing method comprising the step of applying a charged particle beam to a workpiece to process it using the charged particle beam scan and irradiation method according to claim 1.

* * * * *